United States Patent
Rothe et al.

(10) Patent No.: US 7,974,726 B2
(45) Date of Patent: Jul. 5, 2011

(54) METHOD AND SYSTEM FOR REMOVING EMPTY CARRIERS FROM PROCESS TOOLS BY CONTROLLING AN ASSOCIATION BETWEEN CONTROL JOBS AND CARRIER

(75) Inventors: Jan Rothe, Dresden (DE); Konrad Rosenbaum, Pirna (DE)

(73) Assignee: Advanced Micro Devices, Inc., Austin, TX (US)

( * ) Notice: Subject to any disclaimer, the term of this patent is extended or adjusted under 35 U.S.C. 154(b) by 694 days.

(21) Appl. No.: 12/016,425

(22) Filed: Jan. 18, 2008

(65) Prior Publication Data

US 2008/0299684 A1 Dec. 4, 2008

(30) Foreign Application Priority Data

May 31, 2007 (DE) .................. 10 2007 025 339

(51) Int. Cl.
*G06F 19/00* (2011.01)
*G06F 7/00* (2006.01)
*B65H 1/00* (2006.01)

(52) U.S. Cl. ........ 700/112; 700/102; 700/105; 700/121; 700/217; 700/218; 414/222.02; 414/222.07; 414/222.09; 414/222.13; 414/935

(58) Field of Classification Search .............. 700/95, 700/97, 99–102, 112, 214, 217, 218, 121, 700/105; 414/222.01, 222.02, 222.07, 222.09, 414/222.11, 222.13, 416.02, 935
See application file for complete search history.

(56) References Cited

U.S. PATENT DOCUMENTS

| | | | | |
|---|---|---|---|---|
| 5,536,128 | A | 7/1996 | Shimoyashiro et al. | 414/273 |
| 6,122,566 | A * | 9/2000 | Nguyen et al. | 700/218 |
| 6,129,496 | A | 10/2000 | Iwasaki et al. | 414/222.01 |
| 6,134,482 | A * | 10/2000 | Iwasaki | 700/121 |
| 6,169,935 | B1 | 1/2001 | Iwasaki et al. | 700/214 |
| 6,612,797 | B1 * | 9/2003 | Bonora et al. | 414/217 |
| 6,622,845 | B1 * | 9/2003 | Heinrich et al. | 198/349 |
| 6,726,429 | B2 * | 4/2004 | Sackett et al. | 414/217 |
| 6,748,282 | B2 * | 6/2004 | Lin | 700/95 |
| 6,769,855 | B2 * | 8/2004 | Yokomori et al. | 414/416.02 |
| 6,968,248 | B1 * | 11/2005 | Mata et al. | 700/99 |
| 7,151,980 | B2 * | 12/2006 | You et al. | 700/214 |
| 7,337,032 | B1 * | 2/2008 | Nettles et al. | 700/100 |
| 7,379,785 | B2 * | 5/2008 | Higashi et al. | 700/112 |
| 7,512,454 | B1 * | 3/2009 | Li et al. | 700/97 |
| 7,571,020 | B2 * | 8/2009 | Schmidt | 700/101 |
| 7,603,195 | B2 * | 10/2009 | Puri et al. | 700/112 |
| 7,603,196 | B2 * | 10/2009 | Duffin et al. | 700/112 |

(Continued)

FOREIGN PATENT DOCUMENTS

DE 199 21 243 C2 11/2000

(Continued)

OTHER PUBLICATIONS

Letter from foreign associate mailed May 13, 2008.
Translation of Official Communication issued Mar. 18, 2008.

*Primary Examiner* — Crystal J Barnes-Bullock
(74) *Attorney, Agent, or Firm* — Williams, Morgan & Amerson

(57) ABSTRACT

By providing an under-specified specification for designating a destination carrier in a respective control job or control message, a high degree of flexibility in determining the destination of processed substrates may be obtained, thereby also allowing the removal of a source carrier for enhancing load port availability in complex semiconductor facilities.

22 Claims, 4 Drawing Sheets

U.S. PATENT DOCUMENTS

| | | | |
|---|---|---|---|
| 7,672,748 B2 * | 3/2010 | Chik et al. | 700/112 |
| 7,697,445 B2 * | 4/2010 | Yarger et al. | 370/248 |
| 7,720,557 B2 * | 5/2010 | Teferra et al. | 700/112 |
| 2006/0088272 A1 * | 4/2006 | Gilchrist et al. | 385/147 |
| 2006/0190118 A1 * | 8/2006 | Teferra et al. | 700/112 |
| 2008/0275582 A1 * | 11/2008 | Nettles et al. | 700/100 |
| 2009/0016860 A1 * | 1/2009 | Kaneko et al. | 414/222.11 |

FOREIGN PATENT DOCUMENTS

| | | |
|---|---|---|
| DE | 199 52 194 A1 | 5/2001 |
| DE | 199 22 936 B4 | 4/2004 |
| EP | 0 654 721 A1 | 12/1991 |
| JP | 2002016120 A * | 1/2002 |

* cited by examiner

METHOD AND SYSTEM FOR REMOVING EMPTY CARRIERS FROM PROCESS TOOLS BY CONTROLLING AN ASSOCIATION BETWEEN CONTROL JOBS AND CARRIER

BACKGROUND OF THE INVENTION

1. Field of the Invention

Generally, the present disclosure relates to the field of fabricating products, such as semiconductor devices, in a manufacturing environment including process tools exchanging transport carriers with an automated transport system, wherein the products, such as substrates for semiconductor devices, are processed on the basis of groups or lots defined by the contents of the transport carriers.

2. Description of the Related Art

Today's global market forces manufacturers of mass products to offer high quality products at a low price. It is thus important to improve yield and process efficiency to minimize production costs. This holds especially true in the field of semiconductor fabrication, since, here, it is essential to combine cutting-edge technology with volume production techniques. It is, therefore, the goal of semiconductor manufacturers to reduce the consumption of raw materials and consumables while at the same time improve process tool utilization. The latter aspect is especially important since, in modern semiconductor facilities, equipment is required which is extremely cost-intensive and represents the dominant part of the total production costs.

Integrated circuits are typically manufactured in automated or semi-automated facilities, by passing through a large number of process and metrology steps to complete the devices. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask for further processes in structuring the device layer under consideration by, for example, etch or implant processes and the like. Thus, layer after layer, a plurality of process steps are performed based on a specific lithographic mask set for the various layers of the specified device. For instance, a sophisticated CPU requires several hundred process steps, each of which has to be carried out within specified process margins to fulfill the specifications for the device under consideration. Since many of these processes are very critical, such as many photolithography steps, a plurality of metrology steps have to be performed to efficiently control the process flow and to monitor the performance of the respective process tools. For example, frequently so-called pilot substrates are processed and subjected to measurement procedures prior to actually releasing the associated group of "parent" substrates in order to test the compliance with predefined process margins. Typical metrology processes may include the measurement of layer thickness, the determination of dimensions of critical features, such as the gate length of transistors, the measurement of dopant profiles, and the like. As the majority of the process margins are device specific, many of the metrology processes and the actual manufacturing processes are specifically designed for the device under consideration and require specific parameter settings at the adequate metrology and process tools.

In a semiconductor facility, a plurality of different product types are usually manufactured at the same time, such as memory chips of different design and storage capacity, CPUs of different design and operating speed and the like, wherein the number of different product types may even reach one hundred and more in production lines for manufacturing ASICs (application specific ICs). Since each of the different product types may require a specific process flow, different mask sets for the lithography, specific settings in the various process tools, such as deposition tools, etch tools, implantation tools, chemical mechanical polishing (CMP) tools and the like, may be necessary. Consequently, a plurality of different tool parameter settings and product types may be simultaneously encountered in a manufacturing environment. Thus, a mixture of product types, such as test and development products, pilot products, different versions of products, at different manufacturing stages, may be present in the manufacturing environment at a time, wherein the composition of the mixture may vary over time depending on economic constraints and the like, since the dispatching of non-processed substrates into the manufacturing environment may depend on various factors, such as the ordering of specific products, a variable degree of research and development efforts and the like. Thus, frequently the various product types may have to be processed with a different priority to meet specific requirements imposed by specific economic or other constraints.

Despite these complex conditions, it is an important aspect with respect to productivity to coordinate the process flow within the manufacturing environment in such a way that a high performance, for example in terms of tool utilization, of the process tools is achieved, since the investment costs and the moderately low "life span" of process tools, particularly in a semiconductor facility, significantly determine the price of the final semiconductor devices. In modern semiconductor facilities, a high degree of automation is typically encountered, wherein the transport of substrates is accomplished on the basis of respective transport carriers accommodating a specific maximum number of substrates. The number of substrates contained in a carrier is also referred to as a lot and the number of substrates is therefore frequently called the lot size. In a highly automated process line of a semiconductor facility, the transport of the carriers is mainly performed by an automated transport system that picks up a carrier at a specific location, for example a process or metrology tool, within the environment and delivers the carrier to its destination, for instance another process or metrology tool that may perform the next process or processes required in the respective process flow of the products under consideration. Thus, the products in one carrier typically represent substrates to be processed in the same process tool, wherein the number of substrates in the carrier may not necessarily correspond to the maximum number of possible substrates. That is, the lot size of the various carriers may vary, wherein typically a "standard" lot size may dominate in the manufacturing environment. For example, one or more pilot substrates, which may be considered as representatives of a certain number of parent substrates contained in a certain number of carriers filled with the standard lot size, may be transported in a separate carrier, since they may undergo a specific measurement process and therefore may have to be conveyed to a corresponding metrology tool, thereby requiring an additional transport job. Based on the results of the measurement process, the waiting parent substrates may then be delivered to the respective process tool.

The supply of carriers to and from process tools is usually accomplished on the basis of respective "interfaces," also referred to as loading stations or load ports, which may receive the carriers from the transport system and hold the carriers to be picked up by the transport system. Due to the increasing complexity of process tools, having implemented therein a plurality of functions, the cycle time for a single substrate may increase. Hence, when substrates are not available at the tool, although being in a productive state, significant idle times or unproductive times may be created, thereby significantly reducing the utilization of the tool. Thus, typically, the number and configuration of the load ports is selected such that one or more carriers may be exchanged at the load port(s) while the functional module of the process tool receives substrates from another load port to achieve a cascaded or continuous operation of the process tool. The time for the exchange of carriers between the automated transport system and the respective process or metrology tool depends on the transport capacity of the transport system and the availability of the carrier to be conveyed at its source location. Ideally, when a corresponding transport request for a specified lot currently processed in a source tool is to be served, the respective substrates should be available at the time the transport system picks up the carrier including the lot and delivers the carrier at the destination tool such that a continuous operation may be maintained. Consequently, the respective carrier should be delivered to the destination tool when or before the last substrate of the carrier currently processed in the destination tool is entered into the process module so that a continuous operation may be achieved on the basis of the newly arrived carrier. Thus, for an ideal continuous operation of a process tool, one carrier would be exchanged while another carrier is currently processed. Depending on the capacity of the tool interface, for instance the number of load ports provided, a certain buffer of carriers and thus substrates may be provided in order to generate a certain tolerance for delays and irregular deliveries, which may, however, significantly contribute to tool costs. In some circumstances, the required carrier exchange time may be negative, thereby requiring a change of the substrate handling scenario.

Moreover, as the actual carrier exchange time does not substantially depend on the lot size, whereas the time window for performing an actual carrier exchange is highly dependent on the respective lot size, since a small currently processed lot provides only a reduced time interval for exchanging (also referred to as a window of opportunity for carrier exchange) another carrier without producing an undesired idle time, the presence of a mixture of lot sizes, such as pilot lots, development lots, and the like, or the presence of lots having a high priority, may negatively affect the overall performance of process tools.

Moreover, in view of cycle time enhancement for the individual products and to address flexibility in coping with customers' specific demands, the lot size may decrease in future process strategies. For example, currently 25 wafers per transport carrier may be a frequently used lot size, wherein, however, many lots may have to be handled with a lesser number of wafers due to the above requirements, thereby imposing a high burden on the process capabilities of the automatic transport system and the scheduling regime in the facility in order to maintain a high overall tool utilization. That is, the variability of the carrier exchange times for exchanging the carriers with respective load stations of the process tools may be high and thus a significant influence of the transport status in the manufacturing environment on the overall productivity may be observed. Thus, when designing or redesigning a manufacturing environment, for instance by installing new or additional equipment, the tool characteristics with respect to transport capabilities, such as the number of load ports for specific tools and the like, and the capabilities and operational behavior of the AMHS (automated material handling system), may represent important factors for the performance of the manufacturing environment as a whole. The handling of different lot sizes within the manufacturing environment that is designed for a moderately large standard lot size may therefore require highly sophisticated scheduling regimes to compensate for the lack of sufficient carrier exchange capacity in the existing tools. However, the presence of small lot sizes may nevertheless result in a significant reduction of tool utilization, in particular in photolithography tools and related process tools, due to the fact that control of material activities in and between process tools are typically performed on the basis of a standardized platform that includes respective rules and models for managing the operation of transport and substrate handling systems in an equipment independent manner. These standard rules and models are specified by SEMI (Semiconductor and Materials International) standards, thereby allowing a machine supplier independent communication and operation of tools in a manufacturing environment.

Based on these standard rules and respective state models, a supervising control system, such as an MES (manufacturing execution system), may exchange messages within the manufacturing environment, i.e., with the respective process and metrology tools included therein, via appropriately designed communication interfaces. Therefore, the supervising control system may be notified about the current status of the respective process tools and may communicate to the manufacturing environment respective messages for managing the overall process flow in the manufacturing environment. The respective messages, after having been translated into an appropriate format by the respective interfaces, may contain the required information for instructing the various components in the manufacturing environment with respect to the operational behavior in order to obtain the desired response of the manufacturing environment. Thus, the information contained in the respective messages may include data with respect to the processing of substrates, and/or may initiate a sequence of tool activities so as to obtain the required process parameters and other actions required for an appropriate handling of the substrate in the respective process tool. For this purpose, various tool activities may be performed on the basis of standardized state models, thereby resulting in a tool independent response to the instructions forwarded by the supervising control system, which in turn may then be notified on the current status based on the underlying standardized state models. For example, in highly automated manufacturing environments, such as a semiconductor facility, most of the substrate handling activities for conveying the substrates within the process tools and between process tools is based on automatic substrate handling systems and transport platforms, which are represented by respective standardized state models as regulated by respective SEMI standards, wherein, for instance, tool internal substrate handling activities for accepting transport carriers, reloading and loading the respective transport carriers in the tool, may be performed in accordance with E84/E87 SEMI standards. According to these standard state models, a transport carrier may arrive at a specific process tool, that is, at one of a plurality of load ports, and may then be unloaded so as to supply the substrates to the tool internal process modules for performing one or more processes required by the specific process flow of the substrates under consideration.

As previously mentioned, in modern semiconductor facilities, not only the quality of the respective processes has to be monitored and maintained within tight process margins, but also the throughput of the process tool is an important factor in view of overall production costs. Thus, it is an important aspect in managing a complex manufacturing environment to supply substrates to the tool internal modules in a substantially continuous manner so as to substantially avoid idle times of the process modules. Consequently, the scheduling of the arrival of substrate carriers is typically performed in such a manner that the substrate carriers may arrive at the various load ports without resulting in undue idle times of the process modules. For example, in typical manufacturing environments for producing semiconductor devices, a lot size is 25 substrates per carrier and the number of load ports per tool is typically selected so as to allow the arrival of a sufficient number of substrate carriers for obtaining a substantially continuous operation of the process modules. According to the respective SEMI standards for controlling the associated substrate handling activities for supplying the substrates from the substrate carriers to the process modules and finally back to the substrate carrier may not allow the removal of the substrate carrier unless all of the substrates have been returned to the respective substrate carrier. That is, presently the substrate carriers used for transport of substrates to respective load ports of process tools have to stay attached to the load ports while the substrates are being processed in the respective process modules. Under these conditions, the continuous process in the respective process tool may be obtained by providing a respective number of load ports, thereby ensuring that a sufficient number of substrates is present in the process tool at any time. However, there is a general tendency for reducing the number of substrates per lot, for instance using 12 substrates per lot instead of 25, in order to significantly reduce the overall process time for a single substrate. In future strategies for operating semiconductor facilities, even smaller lot sizes have been proposed wherein, with respect to flexibility and reduction of overall process time, lot sizes as small as one substrate may be used, in particular if the size of the individual substrates tends to increase. Thus, when reducing the lot size, several process tools may run into throughput problems due to a non-continuous operation of the process tool, since the existing number of load ports may not allow continuous operation. For example, lithography tools and related process modules may suffer from a reduced throughput while many lithography processes represent the most cost-intensive process steps during the entire process flow for substrates. However, simply increasing the number of load ports may be less than desirable due to the significant increase of required clean room area. In addition, a high degree of compatibility with presently installed semiconductor facilities may be desirable so as to allow the presence of moderately large lot sizes, such as 13-25 substrates per carrier, wherein a plurality of lots with a significantly reduced lot size, such as pilot lots, engineering lots, high priority lots with reduced size and the like, should be processed in the manufacturing environment without causing undue throughput reductions in the various process tools.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for the handling of substrates in a complex manufacturing environment, wherein increased flexibility with respect to substrate handling at respective process tools may be achieved to provide the potential for a substantially continuous supply of substrates with a moderately low number of load ports. For this purpose, the methods and systems disclosed herein provide the possibility for removing empty substrate carriers from load ports of a process tool to improve the load port availability for the delivery of further substrates to be processed in the process tool. To this end, the control regime responsible for managing the process flow of a lot of substrates contained in a substrate carrier may be modified to allow a high degree of flexibility in assigning at least a destination carrier for a lot under consideration. In illustrative aspects disclosed herein, a respective process message established by a supervising control system and representing the process flow for the lot under consideration may be modified to enable a specification of a destination carrier at any appropriate later stage of the processing of the lot under consideration, without requiring a fixed association between the process flow representation and a destination carrier, as is, for instance, the case in presently existing SEMI standards. Consequently, by modifying or enhancing the association between a process flow representation, that is, a message containing information on the process flow, which may also be referred to as a control job, for a lot under consideration and respective substrate carriers used for exchanging substrate with the rest of a manufacturing environment, a high degree of flexibility in managing the tool internal substrate handling may be obtained, without requiring significant modifications in existing SEMI standards. For example, due to the enhanced flexibility for associating substrate carriers with respective control jobs and source and destination carriers, a supervising control system obtains the capability of instructing the process tool to move specific substrates into predetermined carriers, thereby enabling a redistribution of substrates into various carriers. Similarly, substrates initially contained in various carriers may be moved to a single carrier after processing, thereby providing the possibility for splitting and merging lots in a highly flexible manner without requiring additional external substrate handling activities. In particular, the removal of a substrate carrier may readily be accomplished after delivering the substrate into the process modules, since an association or assignment to a respective destination carrier may be determined in the respective control job at any appropriate point in time after the creation of the respective control job, thereby significantly enhancing the load port availability, as previously described.

One illustrative method disclosed herein comprises receiving one or more substrates as a group contained in a source substrate carrier at a load port of a process tool of a manufacturing environment under the control of a host controller. The source substrate carrier is associated with a tool readable control message created by the host controller for controlling a process flow of the group in the process tool, wherein the control message includes a first indication whether or not the source substrate carrier is free for removal from the load port after supplying the group of substrates to the process tool.

Another illustrative method disclosed herein comprises receiving one or more substrates as a group contained in a source substrate carrier at a first one of a plurality of load ports of a process tool of a manufacturing environment under the control of a host controller. The source substrate carrier is associated with a tool readable control message created by the host controller for controlling a process flow of the group in the process tool. The control message includes an indication whether at least one substrate of the group is to be received by a destination substrate carrier other than the source substrate carrier. The method further comprises, after the processing of the at least one substrate, receiving the at least one substrate in the destination substrate carrier other than the source substrate carrier when so indicated in the indication.

An illustrative manufacturing system disclosed herein comprises a process tool comprising a plurality of load ports for exchanging substrate carriers containing substrates to be processed in the process tool with a transport medium. The process tool is controllable on the basis of a control message specifying a control routine for processing substrates in the process tool, wherein the control message includes a first association to a source substrate carrier. Furthermore, the system comprises a host control unit in communication with the process tool and configured to create the control message and to update a second association to a destination substrate carrier after creating and releasing the control message.

BRIEF DESCRIPTION OF THE DRAWINGS

The disclosure may be understood by reference to the following description taken in conjunction with the accompanying drawings, in which like reference numerals identify like elements, and in which.

Figure 1A:
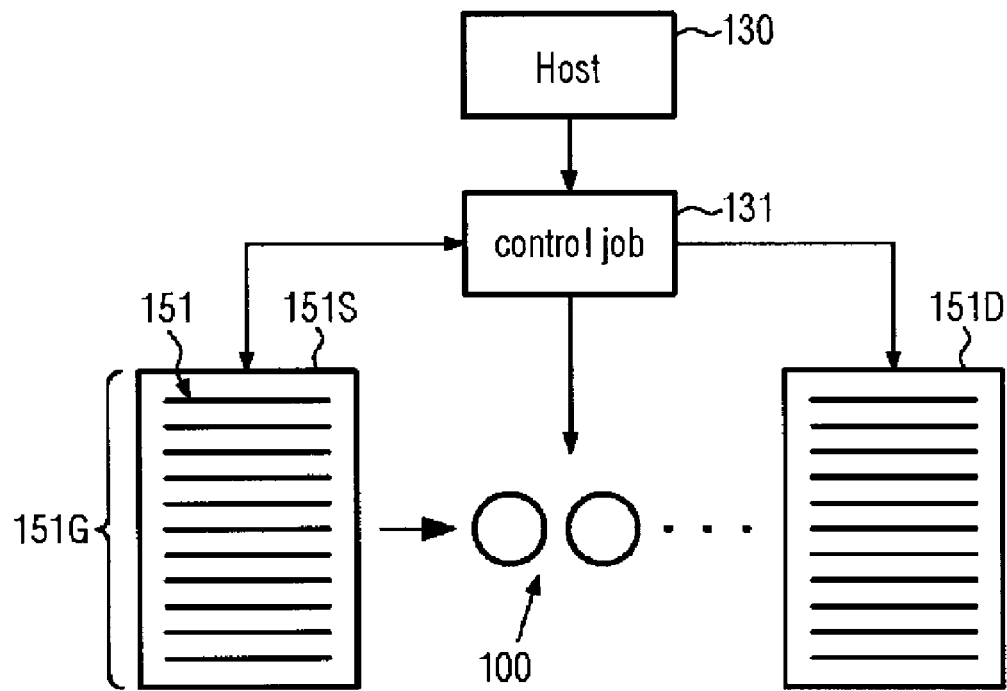
FIG. 1a schematically illustrates a control regime in a complex manufacturing environment using a host control unit for creating a control message including a control job for controlling the process flow of a group of substrates in a semiconductor facility according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to methods and systems used in advanced manufacturing environments, such as semiconductor facilities, or any other production facilities for manufacturing or processing microstructural products, wherein an enhanced flexibility in assigning individual substrates to respective substrate carriers may be achieved, even if groups or lots of substrates of different sizes may be present in the production line. The enhanced flexibility may be achieved in some illustrative aspects by providing techniques enabling the specification of destination carriers of substrates at any time between the creation of a respective command structure for controlling the process flow of the group of substrates under consideration, i.e., the creation of respective control and process jobs, and the actual processing of the substrates, for instance prior to the end of the physical processing of the first substrate of the group under consideration contained in a respective source substrate carrier. Due to this enhanced flexibility in the command structure assigned to a specific group of substrates, the capability of removing empty carriers from load ports of a process tool may be implemented after the last substrate has left the source substrate carrier for processing in the process tool under consideration. Consequently, in addition to the enhanced flexibility of distributing substrates from and into respective substrate carriers without adding additional complexity, throughput issues in advanced manufacturing environments may be significantly relaxed on the basis of existing equipment resources, even if groups of significantly different size are concurrently being processed in the manufacturing environment. Moreover, due to appropriately modifying the command structure, i.e., the control jobs associated with a respective group of substrates, a clear indication is given to the equipment in order to provide information with respect to the tool internal handling of the substrates whether or not the corresponding source substrate carrier is allowed to be removed from the tool after the last substrate has left the respective substrate carrier. The clear indication whether or not a respective source substrate carrier is removable provides the potential for efficiently handling small lot sizes and large lot sizes simultaneously due to enhancing the load port availability of the process tools while not requiring extensive manipulation of tool internal state models and the like.

Consequently, the implementation of the flexibility of destination carrier specification on the basis of a control message provides a backward compatibility in the communication between the process tool and the supervising factory control system, thereby providing compatibility with existing SEMI standards and associated scenarios. Thus, by identifying the fixed association between the command structure for controlling a group of substrates, i.e., control and process jobs for this group, with the respective substrate carrier that delivers this group to the corresponding equipment as the main cause of the inflexibility of existing SEMI standards, the above-described operational mode of the manufacturing environment may be obtained which allows the running of small lots, big lots, small lots and big lots in parallel, while at the same time the techniques disclosed herein may be implemented in existing manufacturing environments with backward compatibility. In particular, an undesired reduced utilization of cost-intensive production tools, such as lithography tools and related process tools, may be significantly reduced or substantially avoided when reducing the number of substrates per lot or when frequently operating lots of small size concurrently with a standard lot size of, for example, 25 substrates per carrier. Even for highly sophisticated production scenarios, for instance assuming a single substrate per carrier, the number of load ports required per equipment may be restricted to a reasonable number due to the enhanced flexibility in port availability based on the modified command structure, that is, the association of source and destination carriers with the command structure.

Furthermore, due to endowing the command structure with increased flexibility with respect to carrier assignment, only minor enhancements of respective SEMI standards, such as the SEMI standard E94, may be necessary for obtaining the enhanced substrate handling flexibility without requiring significant changes in the respective state models and standards that control the tool internal substrate handling processes. Thus, the determination of destination carriers and thus the redistribution of substrates and/or the removal of source carriers may be accomplished under the control of the host control unit, while tool internal processes, that is, complex state models for the tool internal handling of the substrates, may have a minor influence on the overall performance of the process tool. Thus, an appropriate scheduling regime for providing destination carriers may be accomplished by the host controller without requiring undue creation of process messages between the equipment and the controller, which may result in an increased probability for providing appropriate destination carriers at the equipment on time, thereby even further enhancing the overall throughput performance of the respective process tool.

It should be appreciated that the illustrative methods and systems disclosed herein are particularly advantageous in the context of complex manufacturing environments as are typically encountered in facilities for producing or processing microstructure devices, such as integrated circuits and the like, since here a plurality of different product types are to be processed in a highly complex manufacturing environment. The principles of the subject matter disclosed herein may, however, also be applied to any complex manufacturing environment in which respective entities are delivered to a plurality of different process tools which may require a substantially continuous supply for meeting throughput criteria. Consequently, the subject matter disclosed herein should not be considered as being restricted to semiconductor facilities, unless such restrictions are explicitly set forth in the specification and/or the appended claims.

Generally, in typical manufacturing environments, respective work pieces, which will also be referred to as substrates in the case of semiconductor processing, may at least be temporarily grouped into specific entities which require, at least for a part of the entire process flow, to be passed through one or more process steps. The respective entities or groups may typically comprise a plurality of substrates, wherein, in conventional systems, a standard size of the group of lots may be used, which may be 25 substrates for a typical semiconductor facility. As previously explained, the process tools and the respective scheduling regime used for controlling the material exchange between the process tools may be designed so as to obtain a desired high throughput. When the number of substrates per group is reduced or when a significant number of groups with reduced size may be present in the manufacturing environment, respective throughput related issues may occur, as previously described. During the handling of the substrates within the manufacturing environment, a group of substrates may be positioned in a respective substrate carrier, or in several carriers, when the number of substrates belonging to a specified group exceeds the capacity of a single substrate carrier. In complex manufacturing environments, such as semiconductor facilities, the process flow for completing the devices may require a large number of process steps, as previously described, wherein the group of substrates has to be passed through a plurality of process tools in a time-efficient manner, wherein the process flow in one or more process tools is defined by a command structure established by a supervising host controller, which also includes a reference to the substrate carriers required for exchanging the group under consideration between the one or more process tools and the rest of the manufacturing environment by means of a respective transport medium.

FIG. 1a schematically illustrates a typical control regime for managing the processing of a group of substrates. In FIG. 1a, a host control unit 130 may represent any appropriate supervising control system of a complex manufacturing environment, which will be described in more detail later on with reference to FIG. 1c. The host control unit 130 may represent a manufacturing execution system (MES) as is typically used in semiconductor facilities and which is responsible for controlling the flow of substrates through the manufacturing environment and for applying appropriate recipes during the processing of substrates 151, such as substrates appropriate for the production or processing of semiconductor devices and the like. The substrates 151 may define a group or lot 151G that is at least defined by a common processing in a process tool. That is, the substrates 151 of the group 151G may be processed in one or more process tools, thereby receiving a similar treatment. The group 151G may contain from one to any appropriate number of substrates as may be accommodated by a substrate carrier 151A used to deliver the group 151G to one or more process tools, schematically indicated as 100. After processing in the one or more process tools 100, the substrates 151 may be received by a destination substrate carrier 151D. It should be appreciated that, in the scenario shown in FIG. 1a, the group 151G is contained in one source carrier 151S and the group 151G is contained in one single destination carrier 151D after being processed by the one or more process tools 100. This situation is similar to the conventional process regime in which, as previously explained, the source carrier 151S and the destination carrier 151D are one and the same carrier, which stays in the process tools 100 during the processing of the substrates 151. In other illustrative embodiments, the group 151G may be distributed among several source carriers 151S and may be combined into one or more destination carriers 151D, which may not necessarily represent the same carriers as the source carriers 151S. For example, a plurality of source carriers 151S may each include a reduced number of substrates 151, which may then be delivered to a single destination carrier 151D or which may be delivered to a reduced number of destination carriers 151D compared to the number of source carriers 151S. Similarly, the substrates 151 of the group 151G may be split into several destination carriers 151D if instructed by the host control unit 130. The source carrier 151S and the destination carrier 151D represent different carriers, or the source carrier 151S, after supplying the substrate 151 to the one or more process tools 100, may temporarily be removed from the tools 100.

The handling of the group 151G in the one or more process tools 100 is controlled by a respective control structure 131, which may also be referred to as a control job, which may be understood as a control message created and released by the host control unit 130 to initiate appropriate activities in the tools 100 as required for the appropriate processing of the substrates 151. Thus, the control job or message 131 may comprise appropriate information that may be processed in the tools 100, for instance, in respective control units thereof, to initiate respective substrate handling activities, establish appropriate process recipes in respective process modules of the tools 100 and the like, so as to receive the substrates from the source carrier 151S, passing the substrates through respective process modules 101 and finally position the substrates 151 in the one or more destination carriers 151D. As previously explained, in semiconductor facilities, usually most of the tool activities are based on standardized state models, which may be operated on by using standard process messages, thereby achieving a generally tool independent response to certain commands included in the control message 131. For example, the control message 131 may comprise instructions for the tool 100 to supply the substrates 151 according to a specified order to respective process modules of the tool 100, without having to consider any details with respect to the construction of the respective process tool, since standard state models may act as an interface between the instructions contained in the control message 131 and the actual hardware components of the process tools 100.

Figure 1B:
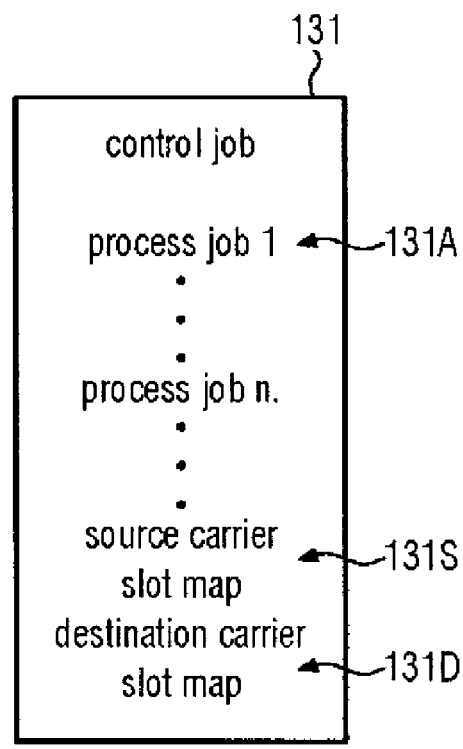
FIG. 1b schematically illustrates a control job and respective associations to a source substrate carrier and a modifiable association to a destination substrate carrier according to illustrative embodiments.

FIG. 1b schematically illustrates the control message 131 according to illustrative embodiments. The message 131 may be a representation of a command structure for controlling the processing and handling of the substrates 151 of the group 151G, as previously explained. For this purpose, the message 131 may comprise a plurality of process jobs 131A, which may represent the processing of substrates 151 of the group 151G which may receive exactly the same type of processes. That is, each of the process jobs 131A may include the respective instructions for instructing the process tool 100 for processing the substrate 151 associated with the process job 131A under consideration in exactly the same manner, for instance, by delivering each of the associated substrates 151 to the same process chamber operated on the basis of the same process recipe. It should be appreciated that the message or control job, which is to be understood as a supervising command structure spanning the plurality of process jobs 131A, may include one process step 131A only, if all substrates 151 have to be processed in the same manner. Moreover, the control message 131 may further comprise an association to the source carrier 151S, indicated as 131S, which may specify the carrier and the position of the individual substrates 151 within the respective lots of the source carrier 151S. Thus, the association or indication 131S may specify the carrier identification and may include a respective slot map for the source carrier 151S.

Similarly, the message 131 may comprise an association or indication for the destination carrier 151B in the form of a carrier identification and a respective slot map, indicated as 131D. In some illustrative embodiments, a high degree of compatibility with conventional command structures may be obtained by allowing that the indication 131D may be missing when creating the control message 131, which may be handled by the process tools 100 such that appropriate default information is used for generating the indication 131D. For instance, the indication 131S for the source carrier may be used as the destination carrier information 131D, as is typically the case in a command structure complying with the respective SEMI standards. In other cases, the destination carrier 151D may be the same as the source carrier 151S, so that the indications 131S, 131D may be identical in the message 131. Contrary to conventional techniques, however, the control message 131 may be modified at any time after creation by the host control unit 130 with respect to the indication 131D, thereby providing the potential for determining an appropriate destination carrier without requiring the presence of the destination carrier 151D at the respective process tool 100 at the time of creating the control message 131 by the host control unit 130, as is the case in conventional regimes. Thus, the capability of a "late" specification of the destination carrier 151D by updating the control message 131 at any appropriate point in time provides a high degree of flexibility in handling the substrates 151 within the tools 100, which enables splitting, merging and the like of substrates, as previously explained.

Furthermore, the "decoupling" of the source carrier and destination carrier indications 131S, 131D provides the possibility of removing the source carrier 151S after supplying all of the substrates 151 according to the instructions contained in the respective process jobs 131A, thereby enhancing the load port availability of the tools 100, as previously explained. Furthermore, using the indication 131D in such a flexible manner provides further means for clearly indicating to the process tool 100 whether the removal of the source carrier 151S is desired or required, or not. This may provide a high degree of compatibility with conventional regimes. For instance, the indications 131S, 131D may have a structure according to standard data structures, for instance as specified according to SEMI standards, that is, the standard E94, thereby providing the capability of extracting standard control messages, while at the same time the indication 131D may include the option of requiring update of the destination carrier information 131D. In one illustrative embodiment, the indication 131D may include an "empty" output specification for the destination carrier, which may indicate both the capability of removing the source carrier 151S after delivery of the substrates and the requirement for receiving an update of the indication 131D at a later stage. In this case, the tool 100, when reading the control message 131, may select an appropriate mode of operation, for instance a standard operating mode in compliance with existing SEMI standards for using the source carrier as destination carrier, or an operational mode signaling the availability of the source carrier 151S to the host control unit 130 after the last substrate is delivered to the process modules of the tool 100 and/or an operational mode for requesting an update of the indication 131D for specifying a destination carrier when the first one of the substrates 151 has entered a specific state of processing in the tool 100.

In one illustrative embodiment, the increased flexibility of modifying the indication 131D at any appropriate time after creating the respective control message 131 may be accomplished by using the respective material output specification object used in an object-based software environment implemented in the host control unit 130 for creating the control message 131. By extending, for instance, the E94 SEMI standard, which is frequently used in regulating the corresponding material input/output specifications in sophisticated control environments, to allow an under-specification with respect to the material output, compatibility with existing control strategies in semiconductor facilities may be achieved. Thus, the "under-specified" control message 131 may be created and released and may be used for controlling the processing of the substrate 151 in a conventional manner, while an appropriate candidate for the destination carrier may be determined. Once an appropriate destination candidate has been determined and the respective carrier 151D is present in the tool 100, the process message 131 may be updated to include the carrier identification and the respective slot map, thereby completing the indication 131D. In the above case of a SEMI-compliant control strategy, the respective feature "set attribute" (S14F3) may be used for a late setting of the attributes of the indications 131S, 131D in the message 131. For this purpose, identical parameters may be used for the input specification 131S, while the output specification 131D may now contain the respective carrier identification and slot map, as desired. A corresponding request for updating the message 131 may be released by the host control unit 130 and may be accepted by the tool 100 when the input specification of the indication 131S contained in the request is equal to the existing input specification 131S of the initially created control message 131. Otherwise, the corresponding request may be declined. Similarly, in some illustrative embodiments, the tool 100 may discard the request for updating the control message 131 when the respective new indication 131D is already used in another control message currently processed in the tool 100.

Figure 1C:
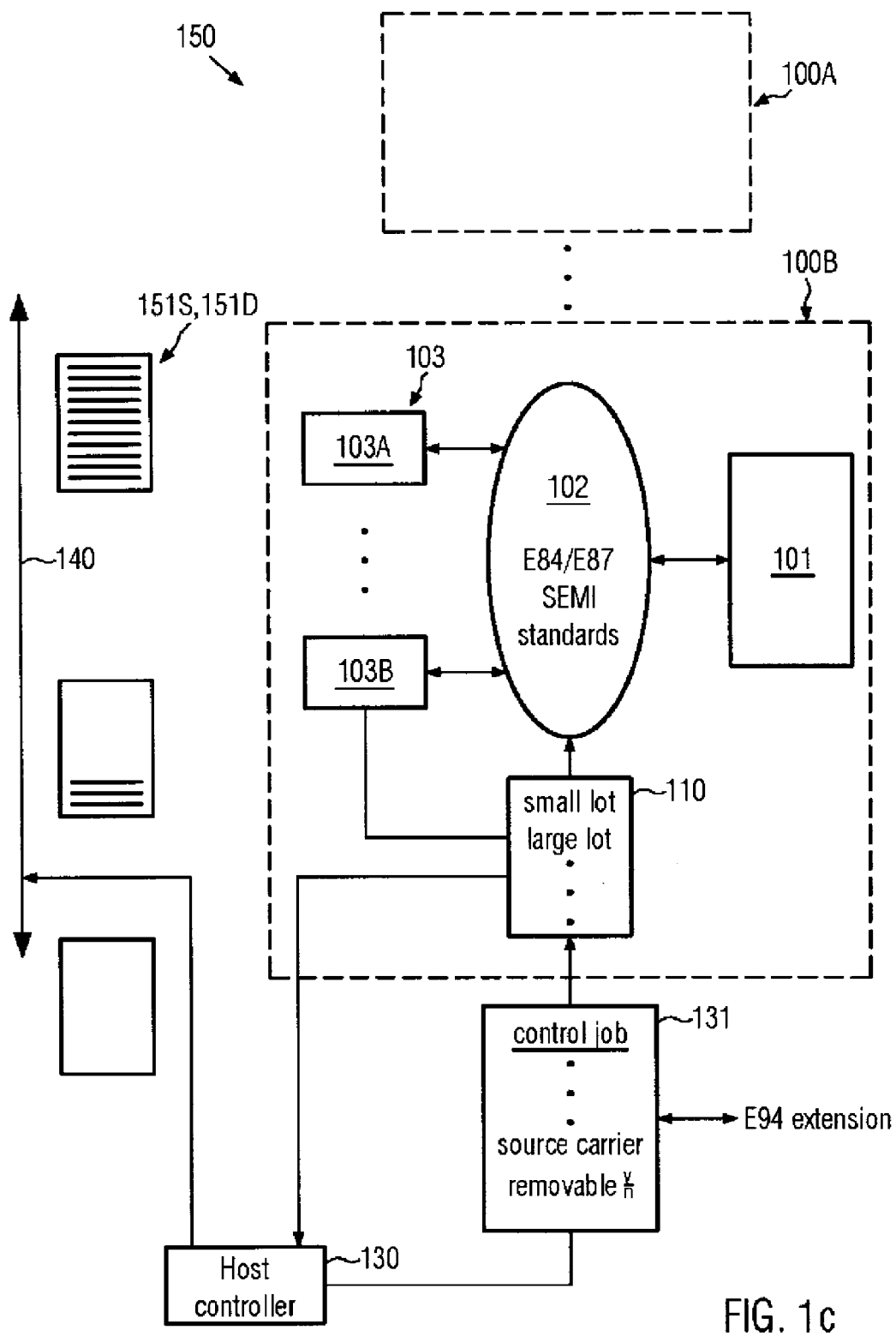
FIG. 1c schematically illustrates a manufacturing environment including a plurality of process tools, a transport medium and a host controller, wherein the process tool is configured to operate on the basis of a control message created by the host controller, which enables a delayed specification of a destination carrier according to further illustrative embodiments.

With reference to FIG. 1c, a manufacturing system will be described in more detail in which the functionality of carrier destination update according to illustrative embodiments is included. FIG. 1c schematically illustrates a manufacturing environment 150 which, in one illustrative embodiment, may represent a manufacturing environment for the fabrication of semiconductor devices, such as integrated circuits, micromechanical devices, micro-optical devices and the like. It should be appreciated that the term "semiconductor device" is to be understood as a generic term for any device being formed on the basis of microelectronic and/or micromechanical manufacturing techniques. The manufacturing environment 150 may comprise a transport medium 140, which, in some illustrative embodiments, may be represented by an automated transport system which is configured to pick up, convey and dispatch the carriers 151S, 151D depending on a predefined schedule. In other cases, the transport medium 140 may include a manual transport of the carriers 151S, 151D. For instance, in semiconductor facilities, the transport medium 140, when represented by an automated transport system, may also be referred to as an automated material handling system (AMHS) that is configured to pick up appropriate transport carriers, such as FOUP (front opening unified pods) and the like, which are typically configured to accommodate a specific maximum number of substrates. For instance, in semiconductor facilities, the respective carriers 151S, 151D may be configured to contain 25 substrates. It should be appreciated that the maximum number of substrates that may be contained in a single carrier 151S, 151D may not necessarily represent a standard lot size, which may be selected on the basis of company internal constraints and the like. The transport medium 140 may further be configured to exchange the carriers 151S, 151D with a plurality of process tools 100A . . . 100B. For this purpose the process tools 100A, 100B may comprise a carrier exchange interface 103, which may be configured to receive a plurality of carriers 151S, 151D from the medium 140 and to store respective carriers 151S, 151D for being picked up by the system 140 when the processing of respective substrates 151 in the carriers within the tool 100A, 100B is completed. In some illustrative embodiments, the respective carrier exchange interface 103 may comprise a plurality of load ports 103A . . . 103B which may represent respective tool stations in which the system 140 may deliver a carrier including substrates to be processed and pick up a carrier including substrates processed within a process module 101 which may, depending on the complexity of the tools 100A, 100B, comprise one or more individual process chambers. As previously explained, the number of load ports 103A, 103B may depend on the configuration of the tools 100A, 100B, wherein an increased number of load ports may provide an increased carrier exchange capability at the expense of increased tool complexity, tool size and tool costs.

The process tools 100A, 100B may further comprise a tool internal substrate exchange interface 102, which may represent a substrate handling system, such as a robot handler, that is configured to receive substrates from the load ports 103A, 103B and supply the substrates to the process module 101 and return processed substrates into the respective carriers in the load ports 103A, 103B. Furthermore, the process tools 100A, 100B may comprise a controller 110, which, in one illustrative embodiment, may represent an integral part of each of the tools 100A, 100B while, in other embodiments, the controller 110 may be external to the tools 100A, 100B and may be operatively connected thereto in order to perform the respective tool related control functions. For example, among others, the controller 110 may be configured to control the operation of the substrate exchange interface 102 on the basis of the control message 131 obtained from the host control unit 130, wherein additional tool internal process information may be used to take into consideration the current tool status and to coordinate the supply of substrates from the load ports 103A, 103B to the process module 101 in compliance with the commands contained in the control message 131, as previously explained. In some illustrative embodiments, the controller 110 is further configured to select an operational mode on the basis of an indication, such as indication 131D, included in the control message 131 in order to provide enhanced flexibility in handling the substrate carriers 151S, 151D in the load ports 103A, 103B and the transport medium 140. For example, the controller 110 may have implemented therein at least a first operating mode, indicated as "small lot" mode, and a second operating mode, indicated as "large lot" mode, wherein the first operating mode may provide the possibility of removing a source carrier 151S of interest from the respective load port 103A, 103B, if desired. For this purpose, the controller 110 may control the operation of the substrate exchange interface 102 and may signal to the host controller 130 when a respective carrier is empty in one of the load ports 103A, 103B and is available for further scheduling, such as for removal from the load port 103A, 103B, for use as a destination carrier 151D for the same or a different group of substrates, and the like. Based on a respective process message output by the controller 110, the host controller 130 may determine an appropriate process strategy for the further usage of the available source carrier 151S. For instance, in view of enhancing the port availability when processing a plurality of small lot sizes in the tools 100A, 100B, the respective source carrier 151S may be removed by the transport medium 140, thereby enabling the arrival of a further carrier 151S for delivering further substrates to the module 101.

Additionally or alternatively, the first operating mode may also provide the potential for redistributing respective substrates from one source carrier 151S to several destination carriers 151D, from several source carriers 151S to a single destination carrier 151D or from several source carriers 151S to several destination carriers 151D, wherein a corresponding redistribution may be instructed by the host controller 130 by appropriately updating respective control messages 131 associated with the respective source carriers 151S.

In the second operating mode, for instance the "large lot" mode, the controller 110 may support a control strategy of well-established control regimes, such as specified in the respective SEMI standards, which may require the presence of the destination carrier 151D at the tools 100A, 100B, when the respective control message 131 is established and includes a fixed association to the source carrier 151S and the destination carrier 151D, or wherein the respective destination carrier specification may be missing and may therefore be replaced by the default as indicated by SEMI standards, thereby using the source carrier as the destination carrier. Consequently, the second operating mode provides compatibility to conventional control strategies, thereby enabling a concurrent existence of small lot sizes and standard lot sizes, wherein, for the standard lot sizes, existing SEMI standards may be used for controlling the operation in the tools 100A, 100B. Thus, any reduction in throughput of respective process tools designed for a predefined standard lot size may be significantly reduced by switching the operating mode when lots of different lot sizes are present in the manufacturing environment 150.

It should be appreciated that the substrate handling interface 102 may nevertheless be controlled on the basis of standard state models as specified, for instance, in the standards E84 and E87, while nevertheless providing enhanced flexibility in defining destination carriers 151D, as previously described. Consequently, the enhanced flexibility may be obtained without significant modifications of highly complex state models involving the operation of the interface 102, but may be obtained by an extension of the E94 SEMI standard relating to the communication between the host controller 130 and the controller 110.

During the operation of the manufacturing system in the environment 150, i.e., the host control unit 130 in combination with one or more of the process tools 100A, 100B, the respective control messages 131 may be created in accordance with process requirements, for instance on the basis of the lot size to which a control message relates and the like, so as to obtain a high overall throughput.

Figure 1D:
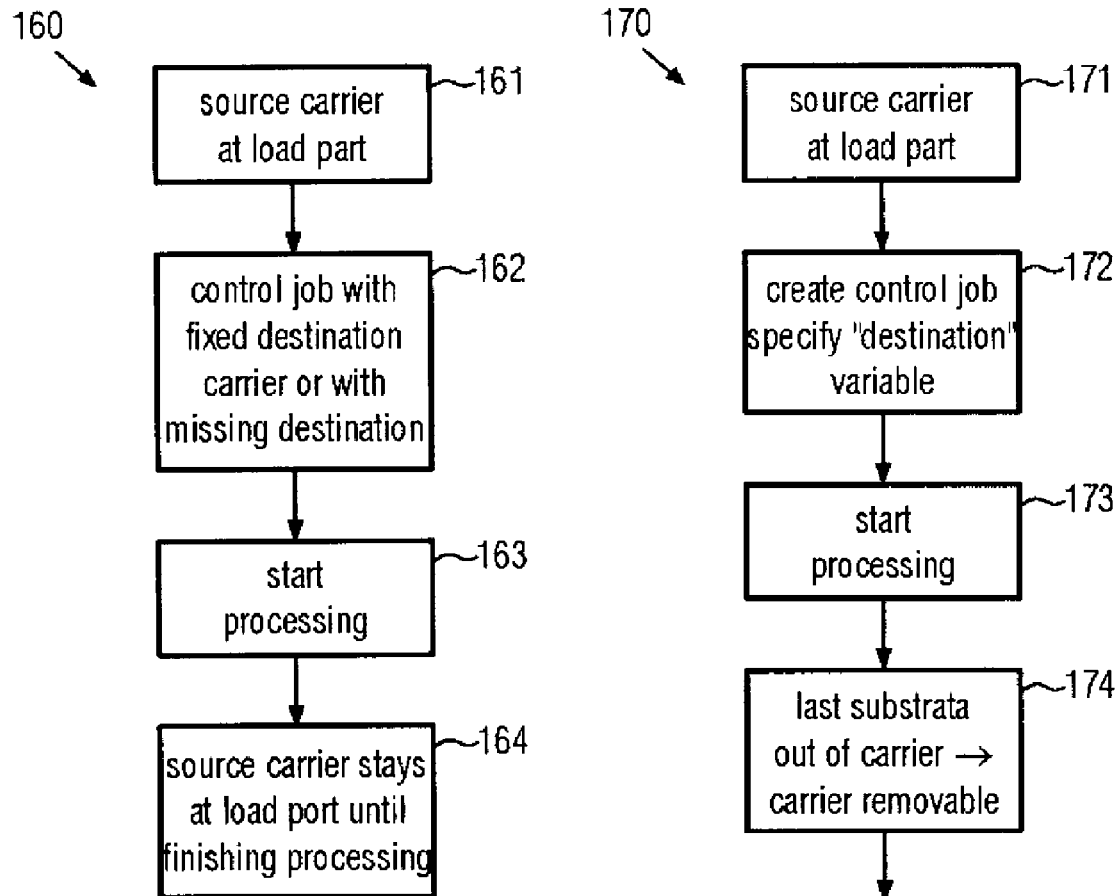
FIGS. 1d-1f schematically illustrate different operating modes prior to and after updating a control message for defining one or more destination carriers according to further illustrative embodiments.
Figure 1E:
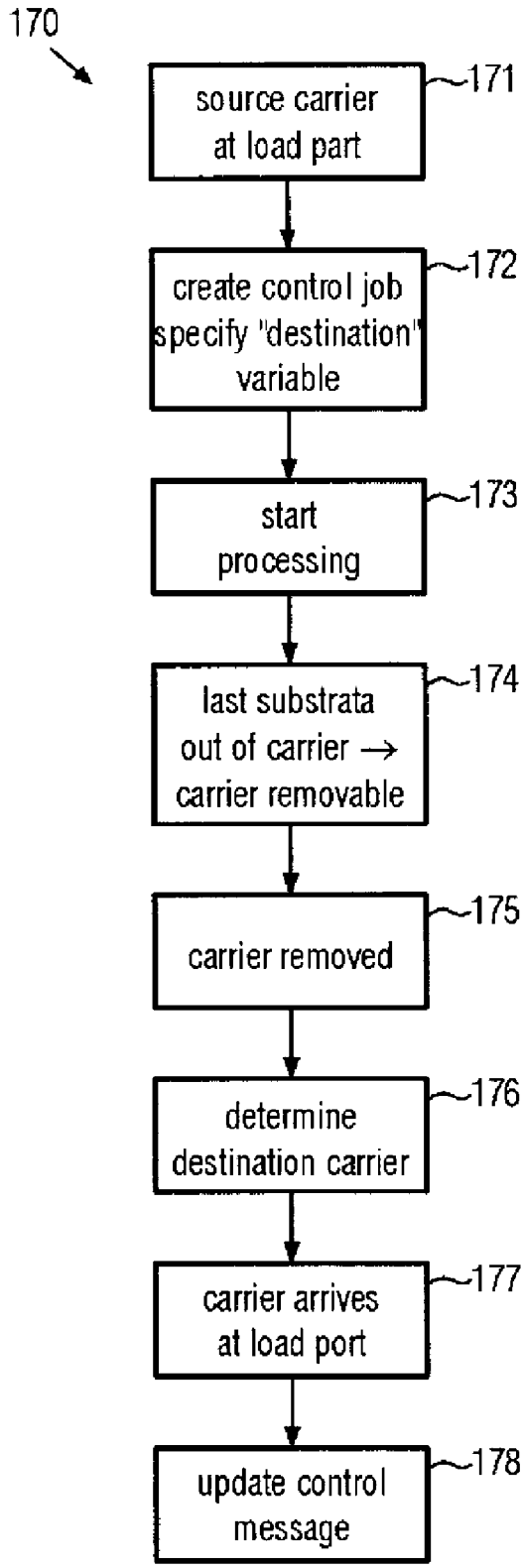
Figure 1F:
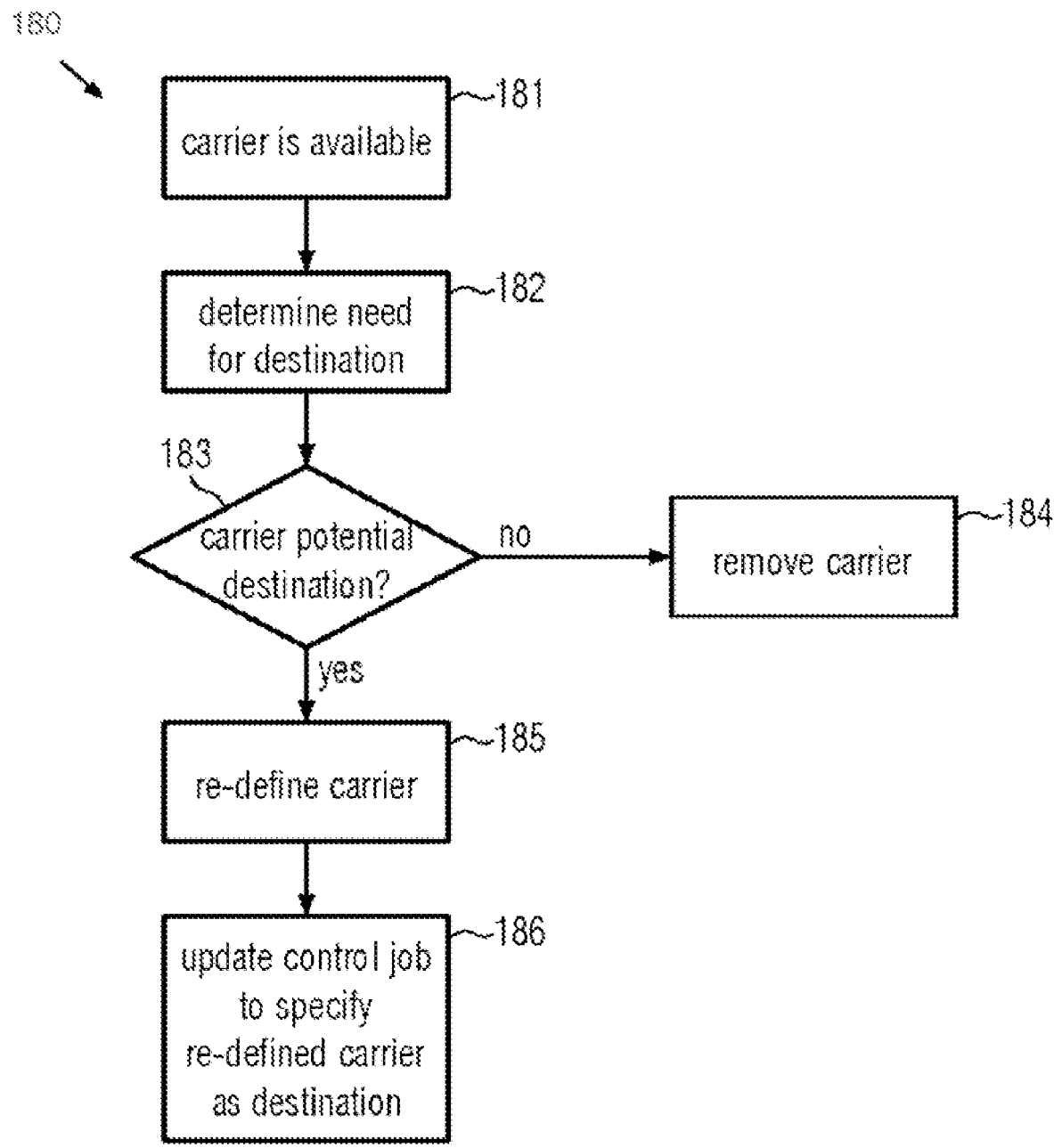

FIGS. 1d-1f schematically illustrate process sequences of different scenarios. In FIG. 1d, a process flow 160 is shown in which a scenario is illustrated that provides a desired compatibility with existing strategies. In block 161, a source carrier having contained therein a group of substrates, such as the group 151G close to a standard lot size, may be present at a load port such as one of the load ports 103A, 103B, and requires processing in the module 101. Therefore, in block 162, the host controller 130 creates a control job or message 131 in which a standard fixed association between a source carrier and a destination carrier is included, for instance on the basis of the existing E96 SEMI standard. This may also include the option that a corresponding specification of the destination carrier may be missing, thereby resulting in specifying the source carrier as the destination carrier.

The decision whether to use the conventional scenario 160 is therefore made by the host control unit 130 on the basis of, for instance, throughput related criteria and the like, as is previously explained. In block 163, the processing of the substrates is started once the control message 131 is forwarded to the control unit 110. In block 164, the source carrier stays at the respective load port until all of the substrates of the respective group are processed and returned to the source carrier.

FIG. 1e shows a process flow 170 describing a scenario for enhanced flexibility in specifying a destination carrier, wherein, according to block 171, the source carrier is at a load port of the process tool and a respective control job or message is to be created for the substrates contained therein. In block 172, the host control unit 130 creates a respective control job, thereby specifying the destination carrier as "variable," that is, it is indicated in the control job that the destination carrier may be specified in any later stage of the processing. For this purpose, in one illustrative embodiment, an appropriate extension of the E94 standard may be used, as previously described. For example, the respective destination map in the material output specification may define an "empty" map. Thus, the control job may be forwarded to the control unit 110, thereby giving a clear indication to the controller 110 that an operating mode with flexible specification of the destination carrier is to be initiated. In block 173, the processing of the substrates in the source carrier is started wherein the substrate handling activities in the interface 102 may be performed on the basis of a SEMI compliant manner, as previously explained.

In block 174, the last substrate of the source carrier may be delivered to the process module 101 which, in one illustrative embodiment, may result in a corresponding indication to the host control unit 130 that the carrier is available, for instance, for being removed or for acting as a destination carrier for a different substrate group. Thus, with respect to small lot sizes and a high availability of the respective load ports of the tool 100A, 100B, in block 175, the host control unit 130 may request removal of the respective carrier by instructing a tool 100A, 100B and the transport medium 140.

Thereafter, the host control unit 130 may determine an appropriate candidate for acting as a destination carrier for the group of substrates previously contained in the source carrier, which may be accomplished on the basis of respective events related to the processing of the respective group of substrates. For example, based on the respective process messages obtained from the tool 100A, 100B, the host controller 130 may determine an expected end of the processing of the group under consideration and may identify an appropriate candidate carrier and schedule the candidate for arriving at an appropriate load port, according to block 176.

In block 177, the respective candidate carrier arrives at the load port and, in step 178, the control message created in step 172 is updated to specify the carrier at the load port as the destination carrier. It should be appreciated that, as previously explained, a plurality of candidates may be determined when a distribution of the respective group of substrates to more than one destination carriers is required. Similarly, the control job created in step 172 may relate to a plurality of source carriers resting in respective load ports of the process tools 100A, 100B, wherein then in step 176 one or more appropriate destination carriers may be determined, depending on the process requirements.

FIG. 1f illustrates a process flow 180 which may represent a strategy in which the steps 171-173 have been performed in a way as previously explained. The scenario 180 now starts in block 181, at which a respective source carrier has delivered the respective substrates contained therein to be processed in the tool module 101 according to the control message 131 being associated to this specific source carrier. Hence, after supplying the last substrate, the respective carrier is available for further scheduling, which may be indicated to the host control unit 130, as previously explained.

In block 182, the need for a destination carrier in the same tool 100A, 100B may be determined by the controller 130, for instance, on the basis of respective tool events, as are typically provided as messages according to the E90 standard and describing the tool status. In block 183, it is evaluated whether the previously emptied carrier may represent a potential destination carrier for the tool 100A, 100B and, if not, in block 184, the carrier may be removed to enhance load port availability. In this case, another appropriate candidate may be scheduled for arrival at the load port when a respective destination carrier is required. In the case that the previously emptied source carrier is identified as a potential destination, in block 183, this carrier may be redefined to indicate the same as an available carrier, wherein, in some illustrative embodiments, a respective process message may be created by the host control unit 130 to avoid a short term removal or undocking of the respective carrier in the corresponding load port. For example, the tool internal controller 110 may have implemented therein a strategy to delay any carrier removal unless an explicit command is obtained from the host controller 130 to do so.

In block 186, a respective control message associated with substrates of a previously emptied carrier, which may now require a destination carrier, may be updated to specify the carrier determined in block 185 as the destination carrier. Thus, the respective substrates may then be loaded into the destination carrier, thereby providing a substantially cascaded operational mode with respect to carrier usage in the process tools 100A, 100B.

As a result, the illustrative methods and systems disclosed herein provide enhanced flexibility in handling different lot sizes within a complex manufacturing environment by enabling the specification of a destination substrate carrier at any appropriate point in time after the creation of a respective control job for the substrate group under consideration. Due to these modifications with respect to carrier association with a respective control job, carrier removal after emptying of the carrier, substrate redistribution and the like may be accomplished without significant modifications in standard state models implemented in existing process equipment. Thus, a backward compatibility with respect to existing control strategies performed on the basis of the SEMI standards may be accomplished while nevertheless enabling the handling of small lot sizes without significant reduction in throughput. Furthermore, the concept disclosed herein may also include respective failure mechanisms for responding to failures in carrier destination definition in a highly efficient manner. For example, in the scenarios described above with reference to the manufacturing environment 150, the host controller 130 may fail in defining an appropriate destination carrier in time or the destination carrier may be defined but may not be available in time due to operator intervention or any other failure in the transport medium 140 and/or the process tools 100A, 1 OOB. In this case, internal buffer storage may be provided to internally buffer the respective substrates to maintain a substantially continuous operation until an appropriate destination carrier is available. In this case, the respective process tool may notify the host controller 130 on the basis of respectively implemented tool events, which may be activated during a respective "small lot" mode, that the tool is waiting for a destination carrier. In other cases, a respective alarm may be issued to indicate an invalid tool status with respect to the presence of a destination carrier. For this case, appropriate recovery scenarios may be defined in advance to rapidly remove respective substrates from a process tool and/ or the scheduling regime in the manufacturing environment may be redesigned to provide sufficient process margins in scheduling respective carriers that have been determined as potential destination carriers. In some of the illustrative embodiments disclosed herein, SEMI specific objects may be used for implementing the possibility of specifying a late definition of the destination carrier. In this case, the material output specifications of the standard E94 may readily be used, as previously explained, to verify the validity of a new destination definition, for instance by respective checks performed by the equipment, such as simply comparing the respective specifications, i.e., the indications 131S, 131D, and discarding a request if a mismatch is detected, as previously explained. Similarly, the host controller 130 may also query the list of all material output specifications of any control messages and may thus determine if a corresponding carrier is available as a destination carrier or not. Consequently, the methods and systems disclosed herein are compatible with current scenarios for running a semiconductor facility, wherein an inter-mix of small and standard lot sizes may be efficiently processed. Furthermore, carriers may be removed when necessary in view of enhanced load port availability without adding significant complexity to tool internal substrate handling processes. The technique disclosed herein is highly flexible in that it allows a very late decision as to which substrate carrier respective substrates have to be returned to, even for varying lot sizes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   receiving one or more substrates as a group contained in a source substrate carrier at a load port of a process tool of a manufacturing environment under the control of a host, said source substrate carrier being associated with a tool readable control message created by the host for controlling a process flow of said group in said process tool, said control message including a first indication whether or not said source substrate carrier is free for removal from said load port after supplying said group to said process tool; and
   modifying, after receiving the source substrate carrier at the load port, the tool-readable control message to include a second indication that at least one substrate of said group is to be received by a destination substrate carrier other than said source substrate carrier, wherein modifying the tool-readable control message comprises generating the second indication in said control message concurrently with processing the substrates in said process tool.

2. The method of claim 1, further comprising receiving, after processing said at least one substrate, said at least one substrate in said destination substrate carrier other than said source substrate carrier when indicated in said second indication.

3. The method of claim 2, further comprising creating said control message including said second indication and updating said second indication prior to delivering said at least one substrate to said destination substrate carrier.

4. The method of claim 1, further comprising removing said source substrate carrier from said load port after supplying said group to said process tool and receiving another source substrate carrier at said load port for supplying another group of one or more other substrates to be processed in said process tool.

5. The method of claim 1, wherein said control message is created after arrival of said source substrate carrier at said load port.

6. The method of claim 5, further comprising determining an appropriate candidate for said destination substrate carrier for receiving said at least one of said substrates of said group.

7. The method of claim 6, further comprising updating said control message to specify said candidate as a destination for said at least one substrate.

8. A method, comprising:
 creating, by a host control unit, a control message for controlling a process flow of one or more substrates contained as a group in a source substrate carrier in a process tool of a manufacturing environment; and
 after creating said control message and concurrently with processing the substrates in the process tool, updating said control message to specify one or more destination substrate carriers for said group for receiving said group after processing in said process tool.

9. The method of claim 8, further comprising removing said source substrate carrier from a load port of said process tool concurrently with processing the substrates in the process tool to enhance availability of said one load port for receiving a further group of substrates to be processed in said process tool.

10. The method of claim 8, wherein said control message is updated before the end of processing of a first one of one or more substrates of said group to indicate at least one destination substrate carrier that is different than the source substrate carrier for at least one of the substrates.

11. The method of claim 10, wherein said control message is created after arrival of said source substrate carrier at said process tool and the method further comprises processing said group according to said control message and indicating availability of said source substrate carrier for removal to said host control unit after supplying a last substrate of said group to a process module of the process tool.

12. The method of claim 11, further comprising determining, by said host, at least one appropriate candidate for said destination substrate carrier for receiving said at least one of said substrates of said group and updating said control message to specify said determined at least one candidate as said one or more destination substrate carriers.

13. The method of claim 12, further comprising scheduling availability of said at least one candidate at said process tool.

14. The method of claim 13, further comprising scheduling said one or more destination substrate carriers so as to arrive at one of a plurality of load ports prior to completing processing of said group.

15. The method of claim 13, wherein, when said at least one candidate is among substrate carriers contained in some of a plurality of load ports of said process tool, instructing said process tool to not remove said at least one candidate.

16. The method of claim 8, further comprising buffering said group in a tool internal substrate buffer when said one or more destination substrate carriers specified during updating said control message is not available after processing said group.

17. The method of claim 8, further comprising buffering said group in a tool internal substrate buffer when processing of said group is completed prior to updating said control message.

18. The method of claim 8, wherein said source substrate carrier remains at said process tool as a destination substrate carrier for said group, when said process message lacks an initial specification of a destination substrate carrier or specifies said source substrate carrier as said destination substrate carrier.

19. The method of claim 8, further comprising notifying said host control unit about invalid tool state when said one or more destination substrate carriers are not available and tool internal substrate buffering is not available.

20. A manufacturing system, comprising:
 a process tool comprising a plurality of load ports for exchanging substrate carriers containing substrates to be processed in said process tool with a transport medium, said process tool being controllable on the basis of a control message specifying a control routine for processing a group of substrates in said process tool and including an indication whether or not one or more source substrate carriers containing said group prior to processing are removable after unloading said group; and
 a host control unit in communication with said process tool and configured to create said control message and to modify said control message concurrently with processing the substrates in the process tool.

21. The manufacturing system of claim 20, wherein said process tool is configured to send a response message to said host control unit based on said indication, said response message indicating an availability of said one or more source substrate carriers for removal from said plurality of load ports.

22. The manufacturing system of claim 20, wherein the host control unit is configured to modify said control message to indicate at least one destination substrate carrier for at least one of the substrates, wherein said at least one destination substrate carrier is different than said one or more source substrate carriers.

* * * * *